US007063796B2

(12) United States Patent
Lutz

(10) Patent No.: US 7,063,796 B2
(45) Date of Patent: *Jun. 20, 2006

(54) MICROMECHANICAL COMPONENT AND METHOD FOR PRODUCING THE SAME

(75) Inventor: Markus Lutz, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 104 days.

This patent is subject to a terminal disclaimer.

(21) Appl. No.: 10/296,021

(22) PCT Filed: Mar. 21, 2001

(86) PCT No.: PCT/DE01/01073

§ 371 (c)(1),
(2), (4) Date: Aug. 21, 2003

(87) PCT Pub. No.: WO01/87765

PCT Pub. Date: Nov. 22, 2001

(65) Prior Publication Data

US 2004/0050161 A1    Mar. 18, 2004

(30) Foreign Application Priority Data

May 18, 2000  (DE) ............................... 100 24 697

(51) Int. Cl.
*C23F 1/00* (2006.01)
*C03C 25/68* (2006.01)

(52) U.S. Cl. .............................. 216/2; 216/36; 257/414

(58) Field of Classification Search .................... 216/2, 216/11, 17, 20, 24, 33, 36; 438/22, 24, 48, 438/50, 52, 53, 689, 694, 696, 700, 702; 73/514.15–514.39; 257/417, 418, 419
See application file for complete search history.

(56) References Cited

U.S. PATENT DOCUMENTS

2003/0173330 A1 *  9/2003  Lutz ........................... 216/11

FOREIGN PATENT DOCUMENTS

| DE | 43 32 843 | 4/1995 |
| DE | 195 37 814 | 4/1997 |
| DE | 100 17 422 | 10/2001 |

OTHER PUBLICATIONS

Kniffin M. L., et al, "Packaging for Silicon Micromachined Accelerometers," International Journal of Microcircuits and Electronic Packaging, International Microelectronics & Packaging Society, U.S. Bd. 19, Nr. 1, 1996, pp. 75-86.

* cited by examiner

Primary Examiner—Parviz Hassanzadeh
Assistant Examiner—Roberts Culbert
(74) Attorney, Agent, or Firm—Kenyon & Kenyon LLP

(57) ABSTRACT

A method of manufacturing a micromechanical component has a substrate (1), a movable sensor structure (6) in a micromechanical functional layer (5) located over the substrate; a first sealing layer (8) on the first micromechanical functional layer (5) which is at least partly structured; a second micromechanical functional layer (10) on the first sealing layer (8), which has at least one sealing function and is anchored at least partly in the first micromechanical functional layer (5); and a second sealing layer (8) on the second micromechanical functional layer (10). The sensor structure (6) is provided with trenches (7) whose width is not larger than a maximum trench width (66), which is sealable by the first sealing layer (8) in the form of plugs (9) which do not extend to the trench bottoms.

33 Claims, 3 Drawing Sheets

MICROMECHANICAL COMPONENT AND METHOD FOR PRODUCING THE SAME

FIELD OF THE INVENTION

The present invention relates to a method of manufacturing a micromechanical component. The present invention also concerns a micromechanical component made by the method.

BACKGROUND INFORMATION

Micromechanical components have been manufactured using the following steps: providing a substrate; providing a first micromechanical functional layer on the substrate; structuring the first micromechanical functional layer in such a manner that it has a sensor structure to be made movable; providing and structuring a first sealing layer on the structured first micromechanical functional layer; providing and structuring a second micromechanical functional layer on the first sealing layer, the second micromechanical functional layer having at least one sealing function and anchored at least partially in the first micromechanical functional layer; making the sensor structure movable; and providing a second sealing layer on the second micromechanical functional layer. German Published Patent Application No. 100 17 422.1 discusses a method of manufacturing a micromechanical component and a micromechanical component made by the method.

Monolithically integrated inertial sensors manufactured by surface micromechanics (SMM), in which the sensitive movable structures are situated on the chip without protection (analog devices) are conventional. This may result in increased expenses for handling and packaging.

This problem may be circumvented by a sensor in which the structures manufactured by surface micromechanics are covered by a second cap wafer. This type of packaging is responsible for a large share (approximately 75%) of the cost of an SMM acceleration sensor. These costs may arise as a result of the large sealing surface area that may be required between the cap wafer and the sensor wafer and are due to the complex structuring (2–3 masks, bulk micromechanics) of the cap wafer.

The structure of a function layer system and a method for hermetic capping of sensors using surface micromechanics is discussed in German Patent Application No. 195 37 814. The manufacture of the sensor structure using conventional technological methods is discussed. The cited hermetic capping is performed using a separate cap wafer made of silicon, which is structured using expensive structuring processes such as KOH etching. The cap wafer is applied to the substrate together with the sensor (sensor wafer) using a seal glass. This may require a wide bonding frame around each sensor chip to ensure an adequate adhesion and sealing ability of the cap. This may limit the number of sensor chips per sensor wafer considerably. Due to the large amount of space which may be required and the expensive manufacture of the cap wafer, sensor capping may incur considerable costs.

German Published Patent Application No. 100 17 422.1 relates to a manufacturing method and component based on a conventional SMM process, and discusses creating epitaxial polysilicon having a thickness of at least 10 μm to form a micromechanical functional layer. No new permeable layer may be required, but conventional processes may be used.

The SMM process is simplified, because the cap wafer may no longer be required and the structures can be bonded from the top due to the second micromechanical functional layer, which assumes at least one sealing function.

Furthermore, the functionality of the process is enhanced, i.e., additional mechanical and/or electrical components are available to the designer for implementing the component. In particular, the following function elements may be produced:

- a pressure sensor membrane in the second micromechanical functional layer;
- a printed circuit structure in the second micromechanical functional layer, which may intersect an additional printed circuit structure provided above the second sealing layer;
- low-resistance aluminum leads in the top of the additional printed conductor structure provided in the second sealing layer;
- a vertical differential capacitor; and
- additional anchor points of the structures of the first micromechanical functional layer in the second micromechanical functional layer.

Conventional IC (Integrated Circuit) packaging methods such as hybrid, plastic, flip-chip, etc., may also be used.

FIG. 6 shows a detail V of a micromechanical component for elucidating the disadvantages sought to be overcome by the present invention.

In FIG. 6, reference number 1 identifies a silicon substrate wafer; 4 identifies a sacrificial oxide, 5 identifies a first micromechanical functional layer in the form of an epitaxial polysilicon layer, 6 identifies a sensor structure (comb structure) to be made subsequently movable by etching sacrificial layer 4 and layer 8, 7 identifies trenches in first micromechanical functional layer 5, 8 identifies a first sealing oxide (LTO, TEOS or the like), which may be a refill layer, 9 identifies plugs in trenches 7, composed of sealing oxide 8, and 10 identifies a second micromechanical functional layer in the form of an epitaxial polysilicon layer having a sealing function.

In the refill process for depositing layer 8, trenches 7 of sensor structure 6 to be made movable are filled, i.e., as shown, plugged at the top only, thus producing a planar surface, on which second micromechanical functional layer 10 having the sealing function is applied, for example, as epitaxial polysilicon. In particular in the case of sensor structures 6 having a high aspect ratio, which are produced from the above-mentioned surface micromechanical epitaxial polysilicon, it is very difficult to fill deep trenches 7. Therefore, as shown, only the wafer surface is covered and trenches 7 are only sealed, i.e., plugged using plugs 9, on the top.

This refill process is only capable of sealing trenches 7 up to a width of approximately 5 μm without much oxide being deposited on the bottom of trench 7. This maximum width A provides the maximum possible vibration amplitude of the respective movable sensor structure 6, which forms a rotational rate sensor, for example.

FIG. 7 shows a modification of the detail of FIG. 6 to elucidate the disadvantages sought to be overcome by the present invention.

If wider trenches 77 (having a width of 15 μm, for example) were to be sealed using the refill process described with reference to FIG. 6, maximum possible deflection A' of a movable sensor structure 6 would be further limited, namely to the thickness of refill material 8 on the side wall of movable sensor structure 6 (after removal of refill material 8).

FIG. 8 shows another modification of the detail of FIG. 6 to elucidate the disadvantages sought to be overcome by the present invention.

FIG. 8 shows the deposition of refill material 8 on the surface not to scale for greater clarity.

In order to make maximum deflection A" of movable sensor structure 6 of the same magnitude as wider trench 77, wider trench 77 may be completely filled with refill material 8 so that sealing polysilicon 10 will only be deposited above sensor structure 6. This may result in the following disadvantages of the process control:

- a longer deposition process of refill material 8;
- additional required planarization of refill material 8, because high steps are created and no accurate lithography, required for contact holes 22, for example, may be possible any longer; and
- a long and more complex process for removing the refill material.

SUMMARY OF THE INVENTION

The manufacturing method of the present invention and the micromechanical component of the present invention may have the advantage that the maximum possible deflection amplitude for the movable sensor structure may be achievable.

According to an exemplary embodiment of the present invention, a comb structure with intermeshing comb teeth is provided in the sensor structure, the sum of the width of a comb tooth and two distances to the next adjacent comb tooth is designed to be less than or equal to the maximum trench width.

According to an exemplary embodiment, a folded spiral spring structure is provided in the sensor structure, the distance between the folds being equal to the maximum trench width, so that the maximum vibration amplitude is equal to the number of folds times the maximum trench width.

According to another exemplary embodiment, a sacrificial layer is provided on the substrate, and the sacrificial layer is etched to make the sensor structure movable. In a simplified version, the substrate may be provided with a sacrificial layer and the first micromechanical functional layer may be provided as a silicon-on-insulator (SOI) structure.

According to another exemplary embodiment, the first micromechanical functional layer is structured in such a manner that it has passages extending to the sacrificial layer. Furthermore, the second micromechanical functional layer is structured in such a manner that it has second passages extending to the first sealing layer, the second passages being connected to the first passages by connection areas of the first sealing layer. The first sealing layer is then etched to remove the connection areas using the second passages as etch channels. Finally, the sacrificial layer is etched using the first and second passages connected together by the removal of the connection areas. This may minimize the cost of the etching processes since it is possible to etch the sacrificial layer and the first sealing layer in one step.

Thus, etch channels running through the first and second micromechanical functional layer and the first sealing layer between them are produced to remove the optionally provided sacrificial layer. This may make it possible to increase the thickness of the second micromechanical functional layer and improve its strength and/or stiffness. As a consequence, it may be possible to span larger areas and expose the components to greater stress. When removing the sacrificial layer, it may not be necessary to be concerned with the aluminum of the printed conductors or the like since it is not applied until a later point in time.

According to another exemplary embodiment, a buried polysilicon layer is provided below the first or second micromechanical functional layer. It may also be possible to dispense with the buried polysilicon and an insulation layer below it since additional wiring levels above the sensor structure are available.

According to another exemplary embodiment, the first and second sealing layer are designed substantially thinner than the first and second micromechanical functional layer.

According to another exemplary embodiment, the first and/or second sealing layers are provided by a non-conforming deposition in such a manner that only the upper areas of the first and second passages, respectively, are plugged. This reduces the etching time for removal of the sacrificial layer since only a portion of the passages is obstructed.

According to another exemplary embodiment, the first and/or second passages are designed as trenches or holes which narrow toward the top.

According to another exemplary embodiment, the first and/or second micromechanical functional layers may be made of a conductive material, which may be polysilicon.

According to another exemplary refinement, the first and/or second sealing layers may be made of a dielectric material, which may be silica.

According to another exemplary embodiment, one or more printed conductor layers, which may be made of aluminum, may be provided on the second sealing layer.

According to another exemplary embodiment, a printed conductor structure may be integrated into the second micromechanical functional layer.

An exemplary embodiment of the present invention may implement movable sensor structures having large maximum vibration amplitudes despite the refill process and without process modifications.

DETAILED DESCRIPTION

Although it is applicable to any micromechanical components and structures, in particular to sensors and actuators, the present invention is elucidated with reference to a micromechanical component, e.g., an acceleration sensor, that is manufacturable using silicon surface micromechanical technology.

In the figures, identical reference symbols denote identical or functionally equivalent components.

Figure 1:
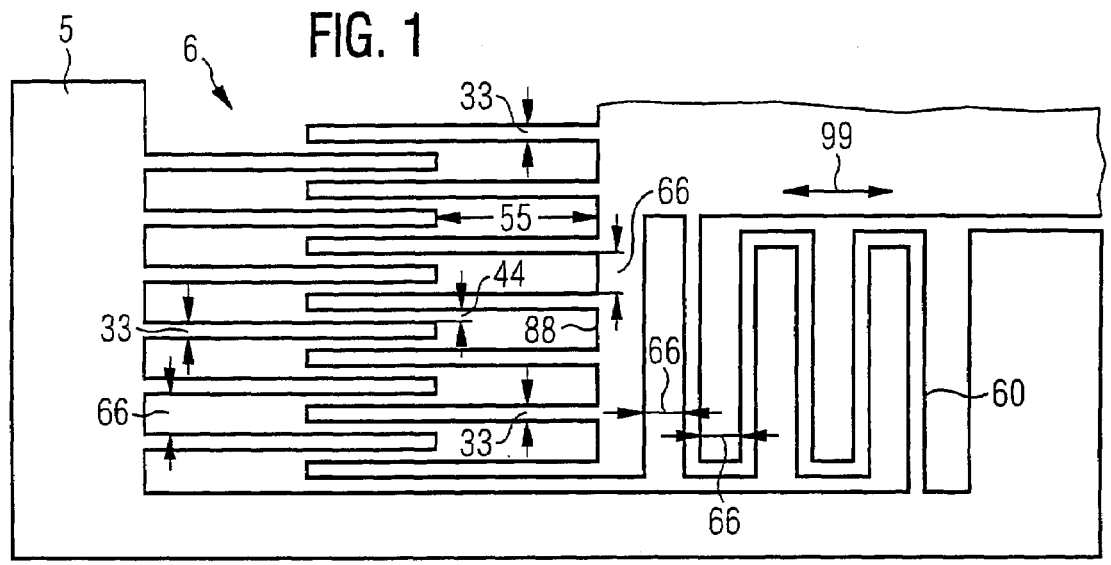
FIG. 1 shows a schematic top view of a first micromechanical functional layer of a micromechanical component according to a first exemplary embodiment of the present invention.

FIG. 1 shows a schematic top view of the first micromechanical functional layer of a micromechanical component according to the first exemplary embodiment of the present invention.

In the exemplary embodiment illustrated in FIG. 1, a comb structure is provided in micromechanical functional layer 5, having a comb drive in the direction of vibration 99, which may have the following design features.

No distance between two structural elements is greater than maximum distance 66, which may be sealed by the refill process. This maximum distance may be approximately 5 rm. This may allow the maximum deflection to be achieved.

In the comb structure, the sum of width 22 of a comb tooth and two distances 44 to adjacent comb teeth is less than or equal to maximum distance 66 (e.g., comb tooth width 2 μm+2×distance 1.5 μm=5 μm).

Each edge 88 of movable sensor structure 6, which is perpendicular to the direction of vibration 99, is provided with a transversal comb structure.

In this example, the transversal comb structures are used as drive structures and detection structures for generating vibrations of sensor structure 6. The maximum vibration amplitude 55 in the direction of vibration 99 is easily determinable from the design.

Furthermore, in the case of the folded helical spring 60, the maximum vibration amplitude 55 is increased due to the number of folds; specifically, maximum vibration amplitude 55 is equal to the number of folds (here six) times maximum distance 66, i.e., the maximum trench width.

This design is also applicable to rotationally vibrating structures by implementing curved transversal comb structures.

Figure 2:
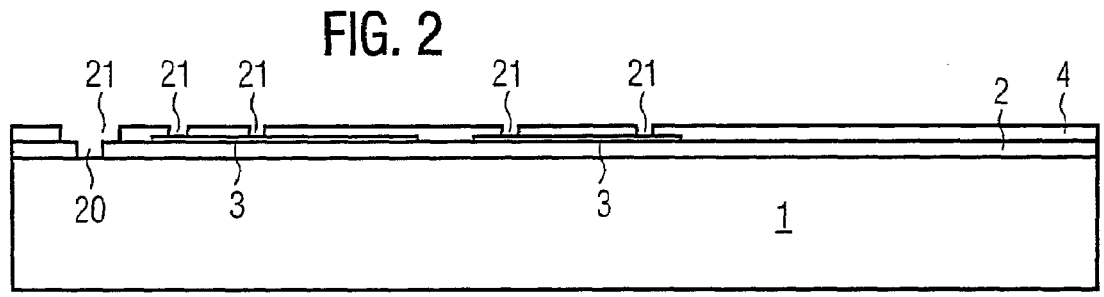
FIG. 2 shows a schematic cross-sectional view of the micromechanical component according to the first exemplary embodiment of the present invention in a first process stage.

FIG. 2 shows a schematic cross-sectional view of a micromechanical component according to the first exemplary embodiment of the present invention in a first process stage.

In FIG. 2, reference number 1 identifies a silicon substrate wafer, 2 identifies a lower oxide, 3 identifies a buried polysilicon layer, 4 identifies a sacrificial oxide, 20 identifies a contact hole in lower oxide 2, and 21 identifies contact holes in sacrificial oxide 4.

In order to manufacture the structure shown in FIG. 2, lower oxide 2 is initially deposited on the entire surface of silicon substrate wafer 1. In a following step, polysilicon is deposited and structured in order to produce printed conductors in buried polysilicon layer 3.

Subsequently sacrificial oxide 4 is applied to the entire surface of the structure, for example, using an LTO (Low Temperature Oxide) method or a TEOS (tetraethyl-orthosilicate) process. Then contact holes 20 and 21 are created at the points provided for this purpose using conventional photo and etching technology.

Figure 3:
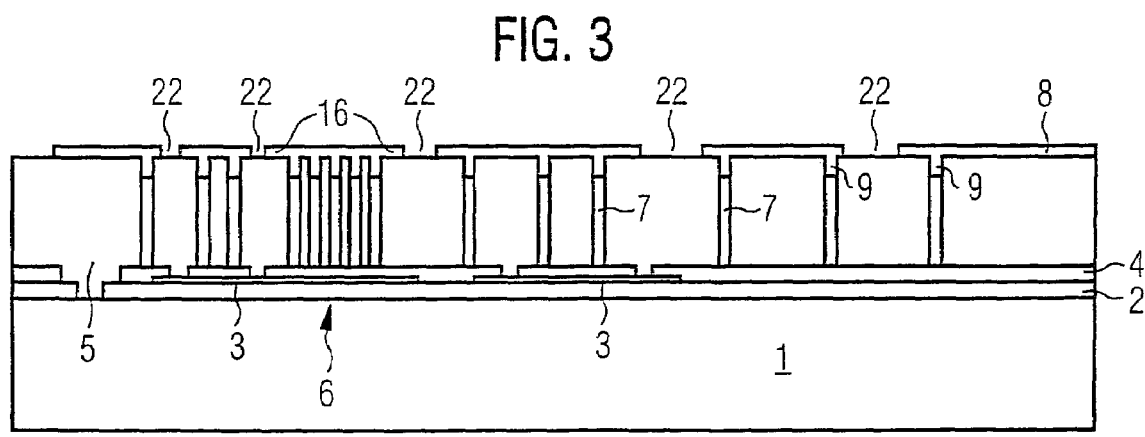
FIG. 3 shows a schematic cross-sectional view of the micromechanical component according to the first exemplary embodiment of the present invention in a second process stage.

FIG. 3 shows a schematic cross-sectional view of the micromechanical component according to the first exemplary embodiment of the present invention in a second process stage.

In addition to the reference symbols introduced previously, in FIG. 3, reference number 5 identifies a first micromechanical functional layer in the form of an epitaxial polysilicon layer, 6 identifies a sensor structure (comb structure) to be subsequently made movable, 7 identifies trenches in first micromechanical functional layer 5, 8 identifies a first sealing oxide (LTO, TEOS, or the like), 9 identifies plugs in trenches 7, made of sealing oxide 8, 16 identifies oxide connection areas for the subsequent sacrificial oxide etching, and 22 identifies contact holes in sealing oxide 8.

In order to produce the structure shown in FIG. 3, initially epitaxial polysilicon is deposited in the conventional manner to form first micromechanical functional layer 5, and micromechanical functional layer 5 is structured to form sensor structure 6 to be made movable and trenches 7.

This is followed by a refill process to seal trenches 7 using sealing oxide 8 and subsequently by optional planarization. Although not mentioned expressly below, such planarization may be performed in principle after any full-surface layer deposition.

Figure 6:
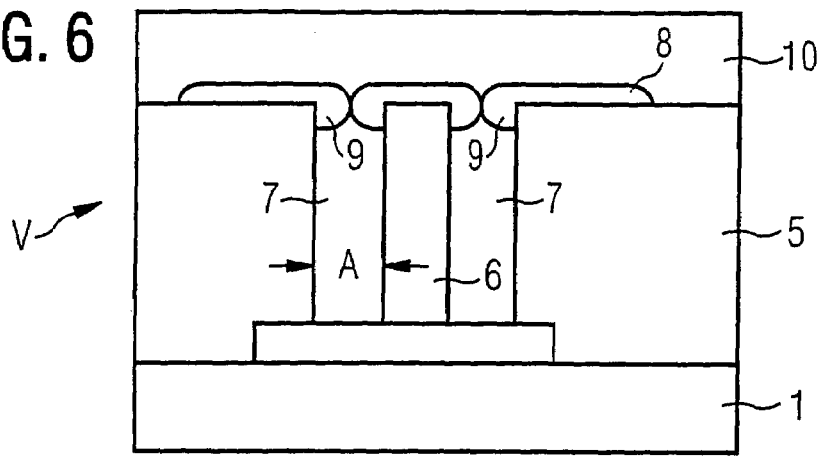
FIG. 6 shows a detail V of a micromechanical component to elucidate the disadvantages sought to be overcome by the present invention.
Figure 7:
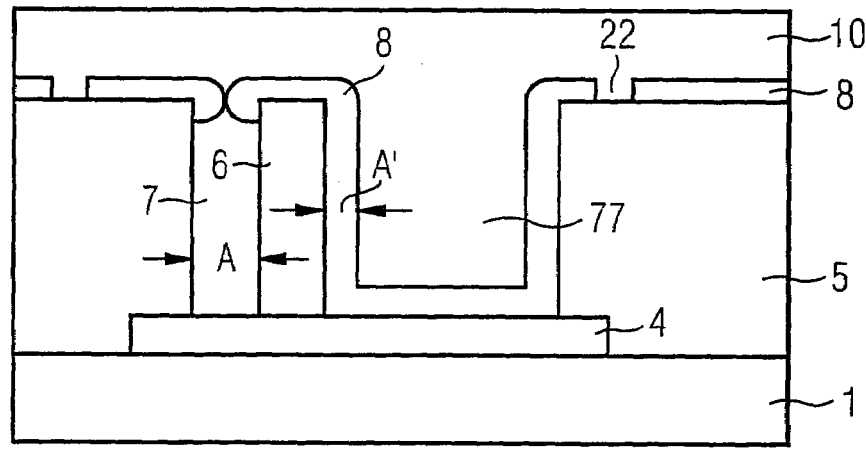
FIG. 7 shows a modification of the detail of FIG. 6 to elucidate the disadvantages sought to be overcome by the present invention.
Figure 8:
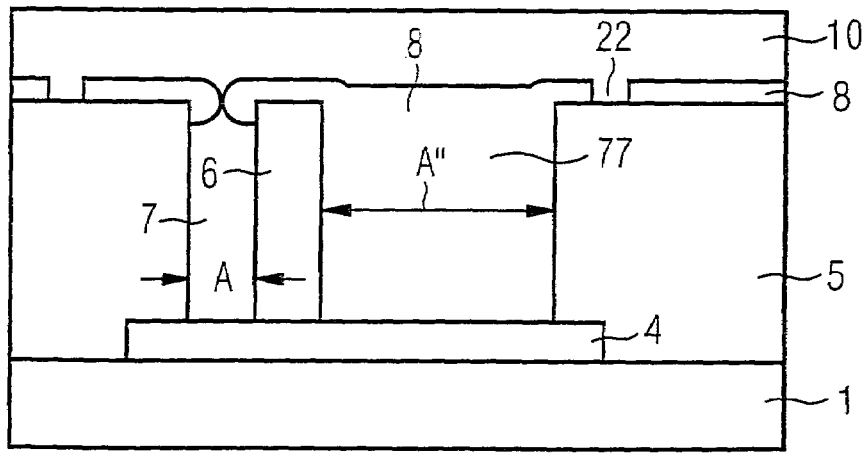
FIG. 8 shows another modification of the detail of FIG. 6 to elucidate the disadvantages sought to be overcome by the present invention.

In the example shown, refill is not complete, but covers the structure underneath 100% only upwards and also provides sealing. This is illustrated in FIG. 6 in more detail.

A process for forming contact holes 22 using conventional photographic and etching methods follows. These contact holes 22 are used for anchoring second micromechanical functional layer 10 to be applied later (see FIG. 4) and for delimiting oxide connection areas 16 for the later sacrificial oxide etching.

Figure 4:
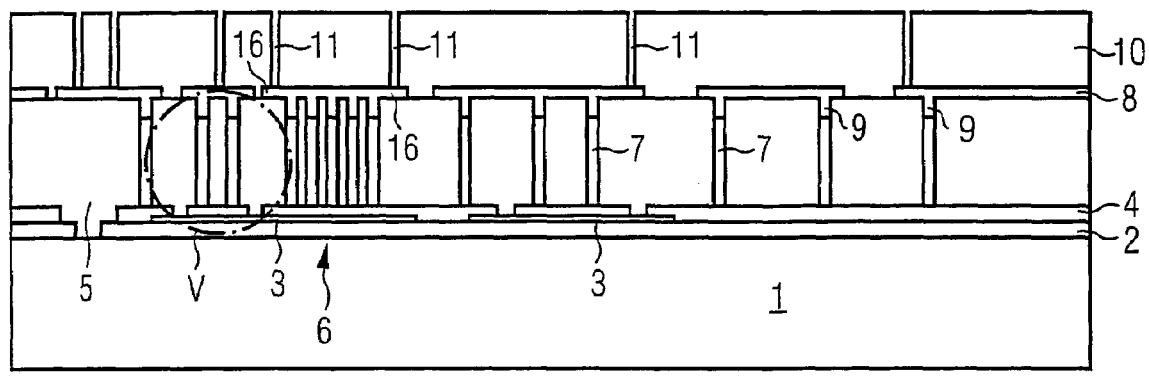
FIG. 4 shows a schematic cross-sectional view of the micromechanical component according to the first exemplary embodiment of the present invention in a third process stage.

FIG. 4 shows a schematic cross-sectional view of the micromechanical component according to the first exemplary embodiment of the present invention in a third process stage.

In addition to the reference symbols already introduced, in FIG. 4, reference number 10 identifies a second micromechanical functional layer in the form of an epitaxial polysilicon layer, and 11 identifies trenches in second micromechanical functional layer 10.

In order to form the structure shown in FIG. 4, second micromechanical functional layer 10 is deposited in a manner similar to first micromechanical functional layer 5 as a stable sealing layer for sensor structure 6 underneath. In addition to this sealing function, second micromechanical functional layer 10 may also be used for contacting, as a lead, as an upper electrode, etc. for the component. Structuring of this layer 10 follows to produce trenches 11, which may be needed later, together with trenches 9, for the sacrificial oxide etching.

Figure 5:
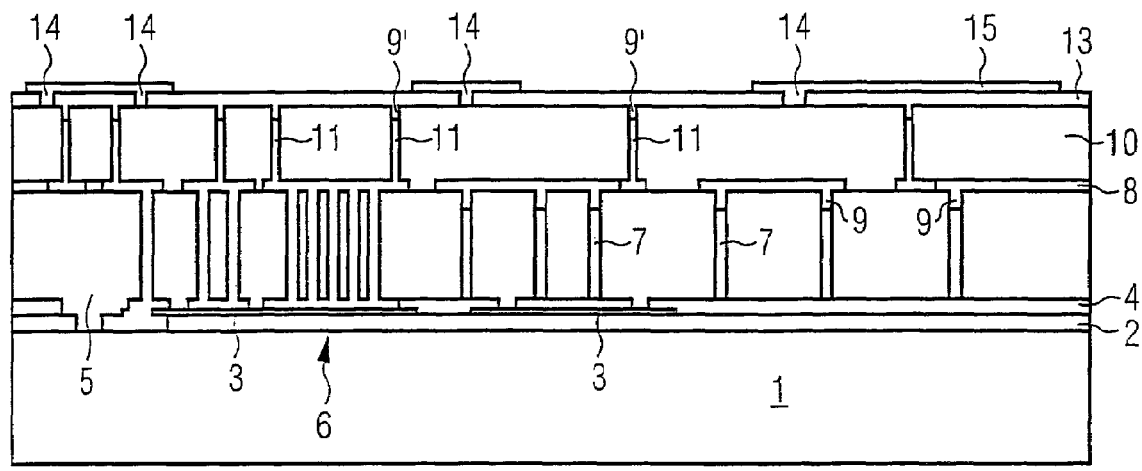
FIG. 5 shows a schematic cross-sectional view of the micromechanical component according to the first exemplary embodiment of the present invention in a fourth process stage.

FIG. 5 shows a schematic cross-sectional view of the micromechanical component according to the first exemplary embodiment of the present invention in a fourth process stage.

In addition to the reference symbols already introduced, in FIG. 5, reference number 13 denotes a second sealing oxide (LTO, TEOS or the like), 14 a contact hole in sealing oxide 13, and 15 a printed conductor level made of aluminum which is connected to second micromechanical functional layer 10 via contact holes 14.

Starting from the process stage shown in FIG. 4, the following steps are carried out to achieve the process stage according to FIG. 5. First, sealing oxide 8 is etched to remove oxide connection areas 16 using second trenches 11 as etch channels. Sacrificial layer 4 is then etched using first and second trenches 7, 11 connected together by removing connection areas 16 as etch channels. A long sacrificial oxide etching is possible since no aluminum is present on the surface at this time.

In a subsequent process step, a second refill process forms second sealing oxide 13, this deposition also not being a conforming deposition but rather only the surfaces of trenches 11 are plugged. This is illustrated in greater detail in FIG. 6. The internal pressure or internal atmosphere contained in sensor structure 6 is a function of the process conditions of the refill process. These parameters determine, for example, the damping of the sensor structure.

Second sealing oxide 13 is then structured to form contact holes 14, and printed conductor level 15 made of aluminum is deposited and structured.

Although the present invention has been described above on the basis of an exemplary embodiment, it is not limited to it but instead is modifiable in a variety of ways.

In particular, any micromechanical base materials such as, e.g., germanium may alternatively be used and not only the silicon substrate cited as an example.

Also, any sensor structures may be formed and not only the acceleration sensor illustrated.

Although not shown in the figures, trenches 7 and 11 may be designed to narrow toward the top in order to promote the non-conforming deposition of first and second sealing layers 8, 13.

The layer thicknesses of first and second micromechanical functional layer 5, 10 may be varied by the epitaxial and planarization process in a simple manner since the sacrificial layer etching does not depend on the permeability of the second micromechanical functional layer.

The micromechanical functional layer/sealing layer sequence may be repeated and it may also be possible to provide a buried printed conductor under each particular micromechanical functional layer above the underlying micromechanical functional layer.

Finally, it may also be possible to apply additional wiring levels made of aluminum or other suitable metals with dielectric materials lying between them.

It may also be possible to planarize the individual levels using chemical-mechanical polishing, for example, in a single polishing step, which may be only for the second sealing level.

What is claimed is:

1. A method of manufacturing a micromechanical component, comprising:
   providing a substrate;
   providing a first micromechanical functional layer on the substrate;
   structuring the first micromechanical functional layer to include a sensor structure; providing a first sealing layer on the first micromechanical functional layer after the structuring of the first micromechanical functional layer, the first sealing layer having at least a covering function and being at least partially anchored in the first micromechanical functional layer;
   structuring the first sealing layer;
   providing a second micromechanical functional layer on the first sealing layer;
   structuring the second micromechanical functional layer; and
   making the sensor structure capable of vibrating;
   providing a second sealing layer on the second micromechanical functional layer;
   wherein a maximum trench width which is sealable by the first sealing layer in a form of a plurality of plugs is determined, the plurality of plugs not extending to a trench bottom; and
   wherein the sensor structure is provided with a plurality of trenches, a first width of the plurality of trenches being not larger than the maximum trench width.

2. The method as recited in claim 1, further comprising:
   providing a comb structure including a plurality of intermeshing comb teeth in the sensor structure;
   wherein a sum of a width of a comb tooth and twice a distance between adjacent intermeshing comb teeth is one of less than and equal to the maximum trench width.

3. The method as recited in claim 1, further comprising:
   providing a folded helical spring structure in the sensor structure;
   wherein a distance between adjacent folds is equal to the maximum trench width, a maximum vibration amplitude of the sensor structure being equal to the number of folds times the maximum trench width.

4. The method as recited in claim 2, further comprising:
   providing a sacrificial layer on the substrate;
   wherein the sacrificial layer and the first sealing layer are etched to make the sensor structure capable of vibrating.

5. The method as recited in claim 4, further comprising:
   structuring the first micromechanical functional layer to include a plurality of first passages extending to the sacrificial layer; and
   structuring the second micromechanical functional layer to include a plurality of second passages extending to the first sealing layer, the plurality of second passages being connected to the plurality of first passages by a plurality of connection areas of the first sealing layer;
   wherein the first sealing layer is etched to remove the plurality of connection areas using the plurality of second passages as a plurality of etch channels;
   and wherein the etching of the sacrificial layer uses the plurality of first passages and the plurality of second passages as a plurality of etch channels, the plurality of first passages and the plurality of second passages being connected by the removal of the plurality of connection areas.

6. The method as recited in claim 2, further comprising:
   providing a buried polysilicon layer underneath one of the first micromechanical functional layer and the second micromechanical functional layer.

7. The method as recited in claim 2, wherein the first sealing layer and the second sealing layer are thinner than the first micromechanical functional layer and the second micromechanical functional layer.

8. The method as recited in claim 5, wherein at least one of the first sealing layer and the second sealing layer is provided by non-conforming deposition so that the plurality of first passages and the plurality of second passages are only plugged in an upper area.

9. The method as recited in claim 5, wherein the plurality of first passages and the plurality of second passages are designed as one of a plurality of trenches and a plurality of holes which narrow toward top.

10. The method as recited in claim 2, wherein at least one of the first micromechanical functional layer and the second micromechanical functional layer is a conductive material.

11. The method as recited in claim 2, wherein at least one of the first sealing layer and the second sealing layer is a dielectric material.

12. The method as recited in claim 2, wherein at least one printed conductor layer is provided on the second sealing layer.

13. The method as recited in claim 2, wherein a printed conductor structure is integrated into the second micromechanical functional layer.

14. A micromechanical component, comprising:
a substrate;
a movable sensor structure in a first micromechanical functional layer situated above the substrate;
a first sealing layer on the first micromechanical functional layer, the first sealing layer being at least partially structured, the first sealing layer having at least one sealing function and being at least partially anchored in the first micromechanical functional layer;
a second micromechanical functional layer on the first sealing layer; and
a second sealing layer on the second micromechanical functional layer; wherein the movable sensor structure is provided with a plurality of trenches, a width of each trench being not larger than a maximum trench width, the plurality of trenches being sealable by the first sealing layer in a form of a first plurality of plugs, the first plurality of plugs not extending to a plurality of trench bottoms.

15. The micromechanical component as recited in claim 14, further comprising:
a comb structure including a plurality of intermeshing comb teeth in the sensor structure;
wherein a sum of a width of a comb tooth and twice a distance between adjacent comb teeth is one of less than and equal to the maximum trench width.

16. The micromechanical component as recited in claim 13, further comprising:
a folded helical spring structure in the sensor structure;
wherein a distance between adjacent folds is equal to the maximum trench width, a maximum vibration amplitude of the sensor structure being equal to a number of folds times the maximum trench width.

17. The micromechanical component as recited in claim 14, wherein:
the movable sensor structure is located over a sacrificial layer situated on the substrate; and
the movable sensor structure is made movable by at least partly removing the sacrificial layer and the first sealing layer.

18. The micromechanical component as recited in claim 17, wherein:
the first micromechanical functional layer includes a plurality of first passages extending to the sacrificial layer;
the second micromechanical functional layer includes a plurality of second passages extending to the first sealing layer; and
the plurality of first passages and the plurality of second passages are connected to each other by a plurality of removed connection areas of the first sealing layer.

19. The micromechanical component as recited in claim 17, further comprising:
a buried polysilicon layer underneath the movable sensor structure between the sacrificial layer and the substrate.

20. The micromechanical component as recited in claim 14, wherein the first sealing layer and second sealing layer are thinner than the first micromechanical functional layer and the second micromechanical functional layer.

21. The micromechanical component as recited in claim 18, wherein at least one of:
the first sealing layer includes a second plurality of plugs for sealing the plurality of first passages; and
the second sealing layer includes a third plurality of plugs for sealing the plurality of second passages.

22. The micromechanical component as recited in claim 18, wherein at least one of the plurality of first passages and the plurality of second passages are one of a plurality of trenches and a plurality of holes which narrow toward top.

23. The micromechanical component as recited in claim 14, wherein at least one of the first micromechanical functional layer and the second micromechanical functional layer is a conductive material.

24. The micromechanical component as recited in claim 14, wherein at least one of the first sealing layer and the second sealing layer is a dielectric material.

25. The micromechanical component as recited in claim 14, further comprising:
at least one printed conductor layer provided on the second sealing layer.

26. The micromechanical component as recited in claim 14, wherein the second micromechanical functional layer includes a printed conductor structure.

27. The micromechanical component as recited in claim 14, wherein the second micromechanical functional layer includes a diaphragm structure.

28. The method as recited in claim 10, wherein the first micromechanical functional layer and the second micromechanical functional layer are manufactured from polysilicon.

29. The method as recited in claim 11, wherein the at least one of the first sealing layer and the second sealing layer is manufactured from silica.

30. The method as recited in claim 12, wherein the at least one printed conductor layer includes aluminum.

31. The micromechanical component as recited in claim 23, wherein the at least one of the first micromechanical functional layer and the second micromechanical functional layer is polysilicon.

32. The micromechanical component as recited in claim 24, wherein the at least one of the first sealing layer and the second sealing layer is silica.

33. The micromechanical component as recited in claim 25, wherein the at least one printed conductor layer includes aluminum.

* * * * *